United States Patent [19]

Yoshida

[11] Patent Number: 5,239,256

[45] Date of Patent: Aug. 24, 1993

[54] REFERENCE VOLTAGE GENERATING CIRCUIT FOR A SEMICONDUCTOR DEVICE FORMED IN A SEMICONDUCTOR SUBSTRATE WHICH GENERATES A REFERENCE VOLTAGE WITH A POSITIVE TEMPERATURE COEFFICIENT

[75] Inventor: Makoto Yoshida, Nara, Japan

[73] Assignee: Sharp Kabushiki Kaisha, Osaka, Japan

[21] Appl. No.: 735,033

[22] Filed: Jul. 24, 1991

[30] Foreign Application Priority Data

Jul. 24, 1990 [JP] Japan ................................ 2-196750

[51] Int. Cl.⁵ .............................................. G05F 3/22
[52] U.S. Cl. ................................. 323/313; 313/314; 313/907; 257/499
[58] Field of Search ............... 323/281, 313, 314, 907; 357/42

[56] References Cited

U.S. PATENT DOCUMENTS 4,672,304  6/1987  Degrauwe et al. .................. 323/314
4,796,174  1/1989  Nadd ...................................... 363/60
5,063,342  11/1991  Hughes et al. ...................... 323/315

FOREIGN PATENT DOCUMENTS 3219811  1/1983  Fed. Rep. of Germany ...... 323/313
203415  10/1983  German Democratic Rep. .................................... 323/313
63-258108  4/1987  Japan .
275010  9/1988  Japan .
245909  10/1990  Japan .
2198559  6/1988  United Kingdom .

*Primary Examiner*—William H. Beha, Jr.

[57] ABSTRACT

First and second P-regions are disposed in N-wells to form first and second PN junctions. The area of the second PN junction is greater than that of the first PN junction. The N-wells and the first and second P-regions are connected between the power supply level for and the ground level, thereby generating a potential difference between the first and second P-regions. This potential difference has a positive temperature coefficient, which is amplified to be supplied as a reference voltage.

28 Claims, 2 Drawing Sheets

REFERENCE VOLTAGE GENERATING CIRCUIT FOR A SEMICONDUCTOR DEVICE FORMED IN A SEMICONDUCTOR SUBSTRATE WHICH GENERATES A REFERENCE VOLTAGE WITH A POSITIVE TEMPERATURE COEFFICIENT

BACKGROUND OF THE INVENTION

1. Field of the Invention

This invention relates to a reference voltage generating circuit, and also to a voltage reducing circuit for a semiconductor device.

2. Description of the Related Art

FIG. 4 shows a conventional reference voltage generating circuit 4 which is used in a voltage reducing circuit 5. The reference voltage generating circuit 4 includes a series circuit of a resistor $R_{11}$, and three N-channel transistors $NT_{11}$, $NT_{12}$ and $NT_{13}$ which is connected between a power supply (Vcc) and the ground level. The gate of each of the transistors $NT_{11}$–$NT_{13}$ is connected to the drain of the respective transistor. A reference voltage $V_{ref}$ which is the sum of the threshold values $V_{th}$ of the transistors $NT_{11}$–$N_{13}$ is output from the node of the resistor $R_{11}$ and the transistor $NT_{11}$ to the inverting input of a differential amplifier $OP_{11}$. The output of the amplifier $OP_{11}$ is coupled to the gate of a P-channel transistor $PT_{11}$ of the voltage reducing circuit 5. The source of the transistor $PT_{11}$ is connected to the power supply (Vcc). A reduced voltage $V_{int}$ is supplied to a load Z from the drain of the transistor $PT_{11}$. The node $T_{11}$ of the transistor $PT_{11}$ and the load Z is connected to the non-inverting input of the amplifier $OP_{11}$. The conductance of the transistor $PT_{11}$ is controlled by the output of the amplifier $OP_{11}$ so that the potential difference $(V_{int}-V_{ref})$ becomes approximately zero. Therefore, the level of the reduced voltage $V_{int}$ is substantially equal to that of the reference voltage $V_{ref}$ (i.e., the sum of the threshold values $V_{th}$ of the transistors $NT_{11}$–$NT_{13}$) without depending upon the power supply $V_{cc}$ and the load Z.

The threshold values $V_{th}$ of the transistors $NT_{11}$–$NT_{13}$ are uneven because of variations in characteristics caused in the manufacturing process. As a result, the reference voltage $V_{ref}$ greatly varies for each reference voltage generating circuit, and consequently the reduced voltage $V_{int}$ widely varies for each voltage reducing circuit. Hereinafter, such a variation of the reference voltage $V_{ref}$ or reduced voltage $V_{int}$ is referred to as "the manufacturing variation".

As shown in FIG. 3, the threshold value $V_{th}$ of a transistor is large at a low temperature, with a result that both the reference voltage $V_{ref}$ and reduced voltage $V_{int}$ increase as the temperature drops (namely, these voltages have a negative temperature coefficient). This causes a problem in that, when MOS transistors with the gate length of 1 μm or less are used as the load Z, the reliability of such MOS transistors is impaired. That is, the short gate length increases the electric field strength, thereby allowing hot carriers to be generated. Hot carriers tend to be generated more easily as the field strength increases or the temperature decreases, and adversely affect the reliability of such micro-sized MOS transistors. As mentioned above, in the conventional reference voltage generating circuit (and hence in the conventional voltage reducing circuit), the reference voltage $V_{ref}$ (and the reduced voltage $V_{int}$) increases as the temperature drops, resulting in that the generation of hot carriers is accelerated. This produces a detrimental effect to the reliability of micro-sized MOS transistors, especially at a low temperature.

Some reference voltage generating circuits which generate a reference voltage with a reduced or zero temperature coefficient have been proposed (for example, Japanese Patent Publications (Kokai) Nos. 61(1986)-169,920, 63(1988)-258,108, and 2(1990)-75,010). However, these improved circuits cannot generate a reference voltage with a positive temperature coefficient.

SUMMARY OF THE INVENTION

The reference voltage generating circuit of this invention, which overcomes the above-discussed and numerous other disadvantages and deficiencies of the conventional circuits, comprises: a semiconductor substrate; a well having a first conductivity type and being formed in said substrate, said well being connected to a first potential level; at least one first region having a second conductivity type and being formed in said well, said first region and said well forming a first PN junction; at least one second region having the second conductivity type and being formed in said well, said second region and said well forming a second PN junction, said first and second regions being connected to a second potential level, and said first and second PN junctions being different in size from each other; and amplifying means, electrically connected to said first and second regions, for amplifying the voltage difference between said first and second regions, the output of said amplifying means being output as a reference voltage.

Another reference voltage generating circuit according to the invention comprises: a semiconductor substrate; at least one first well having a first conductivity type and being formed in said substrate, said first well being connected to a first potential level; at least one second well having the first conductivity type and being formed in said substrate, said second well being connected to the first potential level; at least one first region having a second conductivity type and being formed in said first well, said first region and said first well forming a first PN junction; at least one second region having the second conductivity type and being formed in said second well, said second region and said second well forming a second PN junction, said first and second regions being connected to a second potential level, and said first and second PN junctions being different in size from each other; and amplifying means, electrically connected to said first and second regions, for amplifying the voltage difference between said first and second regions, the output of said amplifying means being output as a reference voltage.

In another aspect of the invention, a voltage reducing circuit comprises: a semiconductor substrate; a well having a first conductivity type and being formed in said substrate, said well being connected to a first potential level; at least one first region having a second conductivity type and being formed in said well, said first region and said well forming a first PN junction; at least one second region having the second conductivity type and being formed in said well, said second region and said well forming a second PN junction, said first and second being connected to a second potential level, and said first and second PN junctions being different in size from each other; amplifying means, electrically connected to said first and second regions, for amplifying the voltage difference between said first and second regions, the output of said amplifying means being output as a reference voltage; and generating means, connected to the output of said amplifying means, for generating a reduced voltage on the basis of said reference voltage.

Another voltage reducing circuit according to the invention comprising: a semiconductor substrate; at least first well having a first conductivity type and being formed in said substrate, said first well being connected to a first potential level; at least one second well having the first conductivity type and being formed in said substrate, said second well being connected to a first potential level; at least one first region having a second conductivity type and being formed in said first well, said first region and said first well forming a first PN junction; at least one second region having the second conductivity type and being formed in said second well, said second region and said second well forming a second PN junction, said first and second regions being connected to a second potential level, and said first and second PN junctions being different in size from each other; amplifying means, electrically connected to said first and second regions, for amplifying the voltage difference between said first and second regions, the output of said amplifying means being output as a reference voltage; and generating means, connected to the output of said amplifying means, for generating a reduced voltage on the basis of said reference voltage.

In the above configurations of the reference voltage generating circuits and voltage reducing circuits the following characters may be included:

said first potential level is the ground level;
said first conductivity type is the N-type;
said second potential level is a positive level;
said second conductivity type is the P-type;
said first and second PN junctions are forward-biased; and
the ratio of the area of said second PN junction to that of said first PN junction is predetermined.

Thus, the invention described herein makes possible the objectives of:

(1) providing a reference voltage generating circuit in which the manufacturing variation does not occur;

(2) providing a reference voltage generating circuit which accurately generates a reference voltage without suffering the manufacturing variations;

(3) providing a reference voltage generating circuit which generates a reference voltage with a positive temperature coefficient;

(4) providing a voltage reducing circuit in which the manufacturing variation does not occur (5) providing a voltage reducing circuit which accurately generates a reduced voltage without suffering the manufacturing variations; and (6) providing a voltage reducing circuit which generates a reduced voltage with a positive temperature coefficient.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
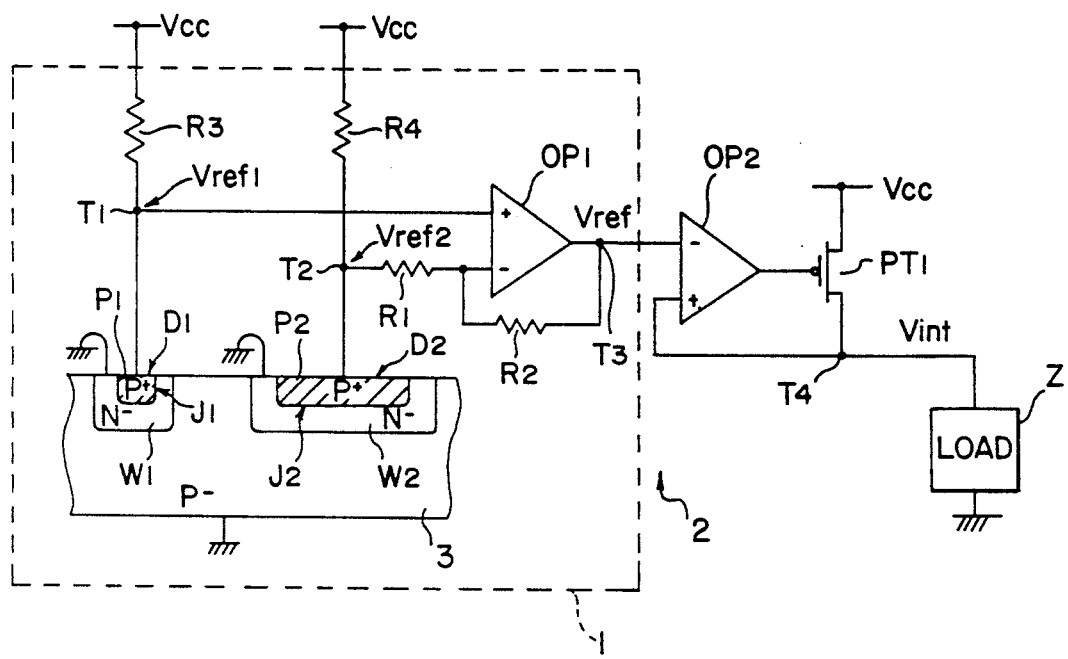
FIG. 1 is a diagram illustrating an embodiment of the invention.

FIG. 1 illustrates a reference voltage generating circuit 1 and voltage reducing circuit 2 according to an embodiment of the invention. The reference voltage generating circuit 1 includes two diodes $D_1$ and $D_2$, two pullup resistors $R_3$ and $R_4$, and a differential amplifier $OP_1$. The diodes $D_1$ and $D_2$ are formed in a $P^-$-substrate 3. More specifically, two $N^-$-wells $W_1$ and $W_2$ are formed in the surface region of the $P^-$-substrate 3, and first and second $P^+$-regions $P_1$ and $P_2$ are formed in the $N^-$-wells $W_1$ and $W_2$ by a well known technique, respectively, whereby first and second PN junctions $J_1$ and $J_2$ are established at the interfaces between the $P^+$-regions $P_1$ and $P_2$ and the $N^-$-wells $W_1$ and $W_2$ to constitute the diodes $D_1$ and $D_2$. The substrate 3 and the $N^-$-wells $W_1$ and $W_2$ are grounded. The area of the second $P^+$-region $P_2$ is larger than that of the first $P^+$-region $P_1$ so that the second PN junction $J_2$ is greater in area than the first PN junction $J_1$. The pullup resistor $R_3$ is connected between the first $P^+$-region $P_1$ and a power supply (Vcc) to form a series circuit of the resistor $R_3$ and the first diode $D_1$ which is connected between the power supply and the ground. Similarly, the pullup resistor $R_4$ is connected between the second $P^+$-region $P_2$ and the power supply ($V_{cc}$) to form a series circuit of the resistor $R_4$ and second diode $D_2$ which is connected between the power supply and the ground. The pullup resistors $R_3$ and $R_4$ have the same value so that currents of the substantially same magnitude flow through the diodes $D_1$ and $D_2$.

The node $T_1$ of the pullup resistor $R_3$ and the first $P^+$-region $P_1$ is coupled to the non-inverting input of the differential amplifier $OP_1$, and the node $T_2$ of the pullup resistor $R_4$ and the second $P^+$-region $P_2$ is coupled to the inverting input of the differential amplifier $OP_1$ through a resistor $R_1$, so that the amplifier $OP_1$ amplifies the difference ($V_{ref1} - V_{ref2}$) between the potential $V_{ref2}$ at the node $T_2$ and the potential $V_{ref1}$ at the node $T_1$. The output (node $T_3$) of the amplifier $OP_1$ is connected to the inverting input through a resistor $R_2$. As described below, the potential $V_{ref2}$ at the node $T_2$ is slightly lower than the potential $V_{ref1}$ at the node $T_1$ by about 0.1 V), and the potential difference $V_D$ ($=V_{ref1} - V_{ref2}$) is determined by the ratio of the size ($S_2$) of the second PN junction $J_2$ to the size ($S_1$) of the first PN junction $J_1$ and increases in proportion to a rise of the temperature.

Generally, the forward voltage $V_F$ of a diode can be expressed as follows:

$$V_F = V_T \ln(I_D/I_S) \tag{1}$$

where $V_T = k \cdot T/q$ k is Boltzmann's constant, T is an absolute temperature, and q is an electron charge), $I_D$ is the current density of the PN junction, and $I_S$ is the reverse saturation current. When the areas of the first and second PN junctions $J_1$ and $J_2$ are designated by $A_1$ and $A_2$, respectively, the area ratio R of the first and second PN junctions is $R = A_2/A_1$. When the PN junctions $J_1$ and $J_2$ are shallow, the areas $A_1$ and $A_2$ of the PN junctions $J_1$ and $J_2$ can be deemed to be respectively equal to those of the $P^+$-regions $P_1$ and $P_2$. As described above, the currents $I_0$ having the same magnitude respectively flow through the diodes $D_1$ and $D_2$, and therefore the current densities $I_{D1}$ and $I_{D2}$ of the first and second PN junctions $J_1$ and $J_2$ can be respectively expressed as:

$$I_{D1} = I_0/A_1 \tag{2}$$

$$I_{D2} = I_0/A_2 = I_0/(R \cdot A_1) \tag{3}$$

The potentials $V_{ref1}$ and $V_{ref2}$ are equal to the forward voltages $V_{F1}$ and $V_{F2}$ of the diodes $D_1$ and $D_2$, respectively. By substituting the expressions (2) and (3) into the expression (1), therefore, the potentials $V_{ref1}$ and $V_{ref2}$ can be respectively obtained by the following expressions (4) and (5):

$$V_{ref1} = V_{F1} = V_T \ln(I_{D1}/I_S) = V_T \ln\{I_0/(A_1 \cdot I_S)\} \tag{4}$$

$$V_{ref2} = V_{F2} = V_T \ln(I_{D2}/I_S) = V_T \ln\{I_0/(R \cdot A_1 \cdot I_S)\} \tag{5}$$

The potential difference $V_D$ can be obtained as follows:

$$\begin{aligned} V_D &= V_{ref1} - V_{ref2} \\ &= V_T \cdot \ln\{I_0/(A_1 \cdot I_S)\} - V_T \cdot \ln\{I_0/(R \cdot A_1 \cdot I_S)\} \\ &= V_T \cdot \ln[\{I_0/(A_1 \cdot I_S)\} \cdot \{(R \cdot A_1 \cdot I_S)/I_0\}] \\ &= V_T \cdot \ln(R). \end{aligned} \tag{6}$$

By substituting $V_T = k \cdot T/q$ into expression (6), the potential difference $V_D$ can be shown as:

$$V_D = k \cdot T \cdot \ln(R)/q \tag{7}$$

Namely, the potential difference $V_D$ varies in proportion to the area ratio R of the first and second PN junctions $J_1$ and $J_2$. The area ratio R can be precisely set by adequately determining the pattern of the first and second P+-regions $P_1$ and $P_2$. According to the embodiment, therefore, the potential difference $V_D$ is not affected by the manufacturing variations. When the area ratio R is 10 (namely, the P+-region $P_2$ is ten times as wide as the P+-region $P_1$) and the temperature is 27° C., the potential difference $V_D$ (=$k \cdot T \cdot \ln 10$) is approximately 60 mV.

From expression (7), $$\partial(V_D)/\partial T = k \cdot \ln(R)/q \tag{8}$$

Figure 2:
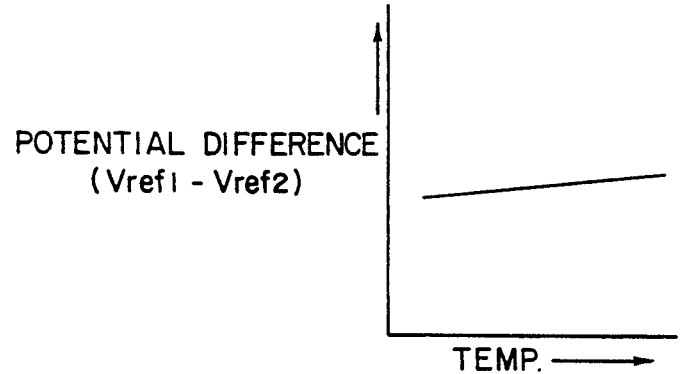
FIG. 2 is a graph showing the temperature dependence of the potential difference in the embodiment of FIG. 1.
Figure 3:
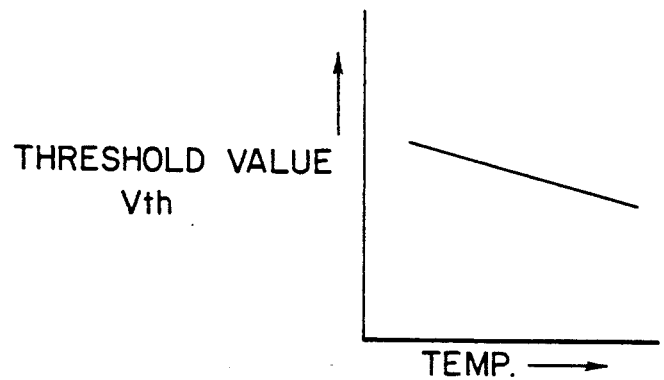
FIG. 3 is a graph showing the temperature dependence of the threshold value in a conventional circuit.
Figure 4:
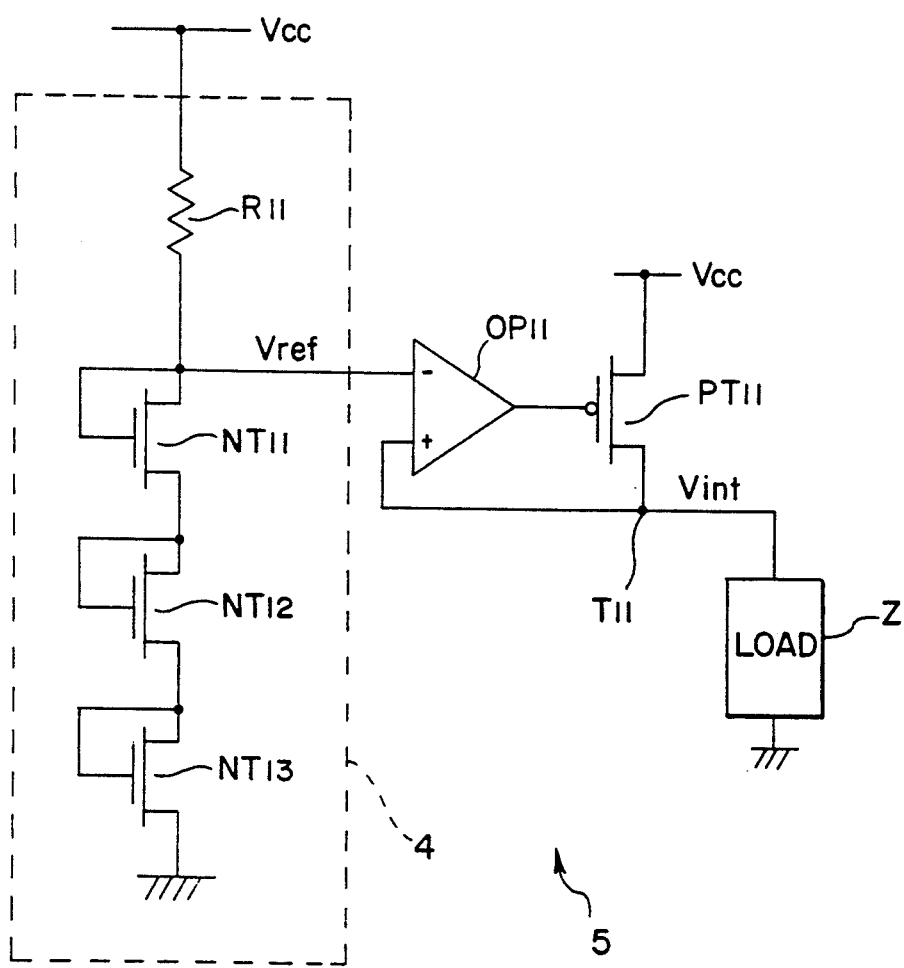
FIG. 4 is a circuit diagram illustrating a conventional voltage reducing circuit.

This means that the potential difference $V_D$ has a positive temperature coefficient as shown in FIG. 2.

The differential amplifier $OP_1$ amplifies the potential difference $V_D$ with a gain determined by the ratio of the resistor $R_1$ to the feedback resistor $R_2$, to generate a reference voltage $V_{ref}$ based on the ground level. The gain of the amplifier $OP_1$ is set so that the level of the reference voltage $V_{ref}$ is equal to that of a reduced voltage $V_{int}$ to be generated by the voltage reducing circuit 2.

The output of the amplifier $OP_1$ is supplied to the inverting input of a differential amplifier $OP_2$. The output of the amplifier $OP_2$ is coupled to the gate of a P-channel transistor $PT_1$. The source of the transistor $PT_1$ is connected the power supply ($V_{cc}$). The reduced voltage $V_{int}$ is supplied to a load Z from the drain of the transistor $PT_1$. The node $T_4$ of the transistor $PT_1$ and the load Z is connected to the noninverting input of the amplifier $OP_2$. The conductance of the transistor $PT_1$ is controlled by the output of the amplifier $OP_2$ so that the potential difference ($V_{int} - V_{ref}$) becomes approximately zero. Therefore, the level of the reduced voltage $V_{int}$ is substantially equal to that of the reference voltage $V_{ref}$. Therefore, the level of the reduced voltage $V_{int}$ is maintained to be substantially equal to that of the reference voltage $V_{ref}$ irrespective of the fluctuation of the power supply $V_{cc}$ or load Z.

The potential difference $V_D$ (=$V_{ref1} - V_{ref2}$) is proportional to the area size ratio of the P+-regions $P_1$ and $P_2$, according to the current-voltage characteristic of the diodes, and the potential difference varies in proportion to the temperature, as shown in FIG. 2. Accordingly, under a given temperature, the reduced voltage $V_{int}$ is determined by the area size ratio of the P+-regions $P_1$ and $P_2$ (i.e., by their patterns), and is therefore less susceptible to the manufacturing variations as compared to the conventional circuit. Also, since the potential difference $V_D$ (=$V_{ref1} - V_{ref2}$) changes in proportion to the temperature, the reduced voltage $V_{int}$ obtained varies in proportion to the temperature. Even when the load Z is a micro-sized MOS transistor, there is no possibility of accelerating the generation of hot carriers, and thus, the reliability of the micro-sized MOS transistor can be prevented from deteriorating. According to the present embodiment, the reference voltage generating circuit or voltage reducing circuit can be used for a semiconductor device at a low temperature without deteriorating the reliability of the semiconductor device.

The manner of forming the first and second wells, and the first and second P+-regions is not restricted to the above description, and can be formed in a variety of manners. For example, the first and second wells may be unitedly formed as one well in a semiconductor substrate, and the first and second regions may be formed in the one well. In this configuration, it is preferable that the first and second regions are sufficiently separated from each other in order to avoid mutual interference. Alternatively, three or more unit combinations of a well and a P+-region formed therein may be formed in a semiconductor substrate, and these unit combinations may be separated into two groups in which the respective unit combinations are connected in parallel.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A reference voltage generating circuit comprising:
  a semiconductor substrate;
  a well having a first conductivity type and being formed in said substrate, said well being connected to a first potential level;
  at least one first region having a second conductivity type and being formed in said well, said first region and said well forming a first PN junction;
  at least one second region having the second conductivity type and being formed in said well, said second region and said well forming a second PN junction, said first and second regions being connected to a second potential level, said first and second PN junctions being different in size from each other and the magnitude of a first current which flows across said first PN junction is substantially the same as the magnitude of a second current which flows across said second PN junction; and amplifying means, electrically connected to said first and second regions, for amplifying the voltage difference between said first and second regions, the output of said amplifying means being output as a reference voltage.

2. A reference voltage generating circuit according to claim 1, wherein said first potential level is the ground level.

3. A reference voltage generating circuit according to claim 1, wherein said first conductivity type is the N-type.

4. A reference voltage generating circuit according to claim 1, wherein said second potential level is a positive level.

5. A reference voltage generating circuit according to claim 1, wherein said second conductivity type is the P-type.

6. A reference voltage generating circuit according to claim 1, wherein said first and second PN junctions are forward-biased.

7. A reference voltage generating circuit according to claim 1, wherein the ratio of the area of said second PN junction to that of said first PN junction is a predetermined ratio.

8. A reference voltage generating circuit comprising:
a semiconductor substrate;
at least one first well having a first conductivity type and being formed in said substrate, said first well being connected to a first potential level;
at least one second well having the first conductivity type and being formed in said substrate, said second well being connected to the first potential level;
at least one first region having a second conductivity type and being formed in said first well, said first region and said first well forming a first PN junction;
at least one second region having the second conductivity type and being formed in said second well, said second region and said second well forming a second PN junction, said first and second regions being connected to a second potential level, said first and second PN junctions being different in size from each other and the magnitude of a first current which flows across said first PN junction is substantially the same as the magnitude of a second current which flows across said second PN junction; and
amplifying means, electrically connected to said first and second regions, for amplifying the voltage difference between said first and second regions, the output of said amplifying means being output as a reference voltage.

9. A reference voltage generating circuit according to claim 8, wherein said first potential level is the ground level.

10. A reference voltage generating circuit according to claim 8, wherein said first conductivity type is the N-type.

11. A reference voltage generating circuit according to claim 8, wherein said second potential level is a positive level.

12. A reference voltage generating circuit according to claim 8, wherein said second conductivity type is the P-type.

13. A reference voltage generating circuit according to claim 8, wherein said first and second PN junctions are forward-biased.

14. A reference voltage generating circuit according to claim 8, wherein the ratio of the area of said second PN junction to that of said first PN junction is a predetermined ratio.

15. A voltage reducing circuit comprising:
a semiconductor substrate;
a well having a first conductivity type and being formed in said substrate, said well being connected to a first potential level;
at least one first region having a second conductivity type and being formed in said well, said first region and said well forming a first PN junction;
at least one second region having the second conductivity type and being formed in said well, said second region and said well forming a second PN junction, said first and second regions being connected to a second potential level, said first and second PN junctions being different in size from each other and the magnitude of a first current which flows across said first PN junction is substantially the same as the magnitude of a second current which flows across aid second PN junction;
amplifying means, electrically connected to said first and second regions, for amplifying the voltage difference between said first and second regions, the output of said amplifying means being output as a reference voltage; and
generating means, connected to the output of said amplifying means, for generating a reduced voltage on the basis of said reference voltage.

16. A voltage reducing circuit according to claim 15, wherein said first potential level is the ground level.

17. A voltage reducing circuit according to claim 15, wherein said first conductivity type is the N-type.

18. A voltage reducing circuit according to claim 15, wherein said second potential level is a positive level.

19. A voltage reducing circuit according to claim 15, wherein said second conductivity type is the P-type.

20. A voltage reducing circuit according to claim 15, wherein said first and second PN junctions are forward-biased.

21. A voltage reducing circuit according to claim 15, wherein the ratio of the area of said second PN junction to that of said first PN junction is a predetermined ratio.

22. A voltage reducing circuit comprising:
a semiconductor substrate;
at least one first well having a first conductivity type and being formed in said substrate, said first well being connected to a first potential level;
at least one second well having the first conductivity type and being formed in said substrate, said second well being connected to the first potential level;
at least one first region having the second conductivity type and being formed in said first well, said first region and said first well forming a first PN junction;
at least one second region having a second conductivity type and being formed in said second well, said second region and said second well forming a second PN junction, said first and second regions being connected to a second potential level, said first and second PN junctions being different in size from each other and the magnitude of a first current which flows across said first PN junction is substantially the same as the magnitude of a second current which flows across said second PN junction;

amplifying means, electrically connected to said first and second regions, for amplifying the voltage difference between said first and second regions, the output of said amplifying means being output as a reference voltage; and generating means, connected to the output of said amplifying means, for generating a reduced voltage on the basis of said reference voltage.

23. A voltage reducing circuit according to claim 22, wherein said first potential level is the ground level.

24. A voltage reducing circuit according to claim 22, wherein said first conductivity type is the N-type.

25. A voltage reducing circuit according to claim 22, wherein said second potential level is a positive level.

26. A voltage reducing circuit according to claim 22, wherein said second conductivity type is the P-type.

27. A voltage reducing circuit according to claim 22, wherein said first and second PN junctions are forward-biased.

28. A voltage reducing circuit according to claim 22, wherein the ratio of the area of said second PN junction to that of said first PN junction is a predetermined ratio.

* * * * *